United States Patent [19]

Ito

[11] Patent Number: 4,990,403

[45] Date of Patent: Feb. 5, 1991

[54] DIAMOND COATED SINTERED BODY

[75] Inventor: Toshimichi Ito, Tokyo, Japan

[73] Assignee: Idemitsu Petrochemical Company Limited, Tokyo, Japan

[21] Appl. No.: 459,626

[22] Filed: Jan. 2, 1990

[30] Foreign Application Priority Data

Jan. 20, 1989 [JP] Japan .................... 1-11572

[51] Int. Cl.$^5$ ............................... B32B 9/00
[52] U.S. Cl. .................... 428/408; 428/698;
428/699; 428/701; 428/702; 428/704; 428/936
[58] Field of Search ............... 428/408, 701, 698, 699, 428/702, 704, 936

[56] References Cited

U.S. PATENT DOCUMENTS 4,731,296  3/1988  Kikuchi et al. ............... 428/552
4,734,339  3/1988  Schachrer et al. ............ 428/701

Primary Examiner—Stephen J. Lechert, Jr.
Assistant Examiner—Nina Bhat
Attorney, Agent, or Firm—Armstrong, Nikaido, Marmelstein, Kubovcik & Murray

[57] ABSTRACT

The present invention provides a diamond coated sintered body characterized by having a diamond film formed by a gas phase synthesis method on the surface of a sintered body obtained from a mixture of tungsten carbide and at least one compound selected from the group consisting of carbide and nitride of silicon or boron and, if necessary, additionally at least one compound selected from the group consisting of carbide, oxide, nitride, carbonitride, carbonate, boride and organic compound of at least one element selected from the group consisting of metals and rare earth elements belonging to Groups Ia, IIa, IIIa, IVa, Va, IIIb and IVb of the Mendelejeff's periodic table.

10 Claims, No Drawings

DIAMOND COATED SINTERED BODY

BACKGROUND OF THE INVENTION

1. Field of the Invention

The present invention relates to a diamond coated sintered body and in more detail it relates to a diamond coated sintered body which comprises a sintered body which is a ceramic based super hard sintered body comprising specific components and a diamond film superior in adhesion provided on the surface of the sintered body.

2. Description of the Related Art

Super hard alloy, sintered diamond, single crystal diamond and the like have been used for tools required to have high hardness and wear resistance such as cutting tools, abrading tools, die, and the like.

Among them, diamond tools are especially preferred because of their excellent hardness and wear resistance.

Hitherto, as the diamond tools, there have been used those which comprise a body made of a super hard alloy or high hardness metal on which a sintered diamond or single crystal diamond is mounted by brazing and other methods.

On the other hand, recently, production of diamond coated body has been studied which comprises forming a diamond film by deposition on the surface of a body of super hard alloy or high hardness metal using gas phase diamond synthesis techniques such as CVD method and PVD method and attempt has been made to apply the resulting diamond coated body to the above-mentioned uses.

Since diamond is the hardest substance, it is considered that diamond film formed on the surface of body of super hard alloy and the like can be effectively utilized as a coating material for imparting high hardness or wear resistance to the body or as a protective film for the body. For example, when a diamond film is formed on the surface of body made of super hard alloy used for super hard tools such as cutting tool and abrading tool, further excellent super hard tools should be obtained.

However, adhesion between the surface of super hard alloy and diamond is normally poor and practically usable tools have not yet been obtained.

Therefore, in order to improve adhesion between the surface of super hard alloy and diamond, it has been proposed to form an intermediate layer between the super hard alloy and diamond.

For example, Japanese Patent Kokai No. 58-126972 discloses a super hard alloy with a diamond film which is obtained by firstly forming an intermediate layer comprising at least one selected from carbide, nitride, boride and oxide of a metal of Group IVa, Va or VIa on the surface of a super hard alloy and then forming a diamond film on the intermediate layer.

However, such method as disclosed in the above patent publication employs stepwise film forming method which comprises formation of the intermediate layer and then formation of the diamond film and so this method is troublesome in production steps and besides, although improvement of adhesion is aimed at, the adhesion between super hard alloy and diamond film has not been sufficiently improved to practical level.

There has also been proposed a technique to improve adhesion between the surface of body comprising super hard alloy and diamond without providing an intermediate layer therebetween.

For example, Japanese Patent Kokai No. 63-100182 discloses a super hard alloy with diamond film prepared by forming a diamond film on a tungsten carbide super hard alloy containing a specific amount of Co and comprising tungsten carbide of a specific particle diameter.

However, this product also cannot be said to have sufficiently practical adhesion between super hard alloy and diamond film.

Especially, with increase in the amount of Co added, the thermal expansion coefficient increases and besides diffusion of carbon into Co occurs. As a result, formation of good diamond film becomes difficult and adhesion is also deteriorated and sufficient endurance cannot be attained.

Furthermore, Japanese Patent Kokoku No. 60-59086 discloses a cutting tool made by coating a diamond film 0.5–50μ thick on the surface of a ceramic body comprising $Si_3N_4$ and/or SiC, However, cutting performance is not sufficient.

As the other example, Japanese Patent Kokai No. 1-201476 discloses a method of producing a sintered hard alloy having a diamond film, characterized by bringing a gas obtained by activating a raw material gas containing 2–30 mol % of carbon monoxide and hydrogen gas into contact with the sintered hard alloy and Japanese Patent Kokai No. 1-275759 discloses a sintered hard alloy with a diamond thin film, characterized by comprising a sintered hard alloy, an intermediate layer formed by bringing a gas obtained by exciting a raw material gas containing a carbon source gas in a concentration of at least 2 mol % therein into contact with a layer made on said sintered hard alloy, of at least one metal selected from the group consisting of Groups IVa, Va and VIa metals and Si and having a thickness in the range of 0.05–1 μm, and a diamond thin film formed on said intermediate layer and having a thickness of 0.2–100 μm.

SUMMARY OF THE INVENTION

The present invention has been accomplished in order to solve the above problems.

The object of the present invention is to provide a diamond coated sintered body which can be used as cutting tools, wear resistant tools, wear resistant sintered body etc. and has a long life by improving adhesion between super hard sintered body and diamond film.

That is, a preferred embodiment of the present invention is a diamond coated sintered body characterized by having a diamond film formed by gas phase synthesis method on the surface of a sintered body obtained from (A) tungsten carbide and (B) at least one of carbide or nitride of silicon or boron.

Another preferred embodiment of the present invention is a diamond coated sintered body, characterized by having a diamond film formed by gas phase synthesis method on the surface of a sintered body obtained from (A) tungsten carbide, (B) at least one of carbide and nitride of silicon or boron and (C) at least one compound selected from the group consisting of carbide, oxide, nitride, carbonitride, carbonate, boride and organic compound of at least one element selected from the group consisting of metals and rare earth elements belonging to Groups Ia, IIa, IIIa, IVa, Va, IIIb and IVb of the Mendelejeff's periodic table (hereinafter referred to as merely "the periodic table").

DESCRIPTION OF THE PREFERRED EMBODIMENTS

It is considered that in the conventional super hard alloy having diamond film there exists residual stress between super hard alloy and diamond film and the presence of this causes deterioration of adhesion between the alloy and the diamond film.

It is considered that the diamond coated sintered body of the present invention is excellent in adhesion between diamond film and sintered body as a body because a sintered ceramic body comprising specific components is used.

That is, it is considered that in the sintered body of the present invention, a carbide based composite metal compound sintered body is formed by sintering tungsten carbide and carbide or nitride of specific metal or a further superior carbide based composite metal compound sintered body is formed by sintering tungsten carbide, carbide or nitride of specific metal and furthermore carbide, nitride, oxide, carbonate, carbonitride, boride or organic compound of specific metal.

The mechanism for the adhesion to diamond film and the endurance being much improved by using a sintered body obtained by sintering the specific components as a body is not necessarily clear at present, but, for example, the main reasons can be considered as follows.

That is, when diamond film is formed by gas phase synthesis method on the surface of the above sintered body, this diamond film grows so that diamond produced forms a nearly continuous phase structure with a carbide freshly formed on the surface of the sintered body or metal carbide or carbide based composition previously present on the surface.

Furthermore, since the sintered body is a composite sintered body comprising two or more metal compounds, the sintered body has fine irregularities on the surface or surface pores and the diamond film is formed in such a manner that fine particles of diamond eat into the irregularities or pores and as a result this sintered body more firmly bonds to the diamond film than the conventional super hard alloy.

In addition, since the sintered body used in the present invention as a body is a ceramic super hard material containing neither single metal such as Co, Ni, Fe or the like nor alloy thereof, the sintered body has smaller thermal expansion coefficient than conventional tungsten carbide-Co super hard alloy and has sufficiently small residual thermal shrinkage stress and besides diffusion of carbon does not occurs.

Thus, it is considered that diamond film of high performance is formed on the surface of sintered body and this diamond film is difficult to be peeled off and can be stably held.

The sintered body used in the present invention belongs to a carbide based super hard material (cemented carbide) and it per se has high hardness and wear resistance like conventional super hard alloy. However, since the diamond coated sintered body of the present invention is made by firmly forming a diamond film by gas phase synthesis method on the surface of a sintered body which is the above-mentioned super hard material, it is a super hard body or material having excellent surface characteristics such as further higher hardness and wear resistance and besides having excellent endurance.

The present invention will be explained in more detail below.

The sintered body used as body for diamond film in the present invention may be one which has been molded as sintered body for super hard tools and wear resistant sintered body or may be one which has been partially molded or may be one which has not been molded into specific shapes.

That is, the sintered body is not limited in its shape and may be of any shapes.

In the present invention, the sintered body is used as a body for diamond film formed by gas phase synthesis method.

Method for making the sintered body has no special limitation, but ordinarily it can be suitably made in the following manner.

The sintered body in the present invention can be obtained by sintering tungsten carbide [component (A)] and at least one of carbide or nitride of silicon or boron [component (B)] as raw materials.

If necessary, the resulting sintered body may be processed into desired shape.

Furthermore, the sintered body in the present invention can be obtained by sintering the above-mentioned component (A), the above-mentioned component (B) and at least one compound selected from the group consisting of carbide, oxide, nitride, carbonitride, carbonate, boride and organic compound of at least one element selected from the group consisting of metals and rare earth elements belonging to Groups Ia, IIa, IIIa, IVa, Va, IIIb and IVb of the periodic table and rare earth elements [component (C)] as raw materials.

In this case, too, if necessary, the resulting sintered body may be processed into desired shape.

Tungsten carbide used as component (A) in the present invention include those which are used for conventional super hard tools and as examples thereof, mention may be made of compounds having definite or indefinite atomic ratio expressed by WC, WCx (wherein x represents a positive real number excluding 1 and usually this x is a number larger than 1 or smaller than 1) and these compounds containing other element such as oxygen which is bonded thereto, replaced therewith or introduced therein. Among these compounds, WC is especially suitable.

These may be used singly or in combination of two or more or as a mixture, a solid solution or a composition of two or more.

As examples of carbides and nitrides of silicon or boron of component (B) in the present invention, mention may be made of silicon carbides such as SiC, silicon nitrides such as $Si_3N_4$ and boron carbides such as $B_4C$. Among them, preferred are carbides of silicon, nitrides of silicon and carbides of boron and especially preferred are SiC, $Si_3N_4$, $B_4C$ and the like.

These may be used singly or in combination of two or more or as a mixture, a solid solution or a composition of two or more of them.

As suitable examples of carbides, oxides, nitrides, carbonitrides, carbonates, borides and organic compounds of at least one element selected from the group consisting of metals and rare earth elements belonging to Groups Ia, IIa, IIIa, IVa, Va, IIIb and IVb of the periodic table used as component (C) in the present invention, mention may be made of carbonates of metals belonging to Group Ia of the periodic table such as $Li_2CO_3$, $Na_2CO_3$, and $KCO_3$, carbonates of metals belonging to Group IIa of the periodic table such as $MgCO_3$ and $CaCO_3$, oxides of metals belonging to Group IIa of the periodic table such as MgO, oxides of metals belonging to Group IIIa of the periodic table such as $Y_2O_3$, oxides of metals belonging to Group IVa of the periodic table such as $ZrO_2$ and $TiO_2$, carbides of metals belonging to Group IVa of the periodic table such as TiC, nitrides of metals belonging to Group IVa of the periodic table such as TiN and ZrN, carbides of metals belonging to Group Va of the periodic table such as NbC and TaC, oxides of metals belonging to Group IIIb of the periodic table such as $Al_2O_3$, nitrides of metals belonging to Group IIIb of the periodic table such as AlN, oxides of metals belonging to Group IVb of the periodic table such as $SiO_2$, oxides of rare earth elements such as $ThO_2$, $Ce_2O_3$, $CeO_2$, $Er_2O_3$, $Dy_2O_3$ and $La_2O_3$, carbonitrides such as $Mg(CN)_2$ and TiCN, borides of rare earth elements such as $YB_6$ and $LaB_6$, and alkoxides and alkyl compounds of Mg, Al, Si, Sc, Y and lanthanide rare earth elements.

Among them, preferred are carbides, oxides and nitrides of metals belonging to Groups IIa, IIIa, IVa and IIIb of the periodic table, more preferred are carbides, oxides and nitrides of Mg, Y, B, Al, Ti or Zr, and especially preferred are $Y_2O_3$, $Al_2O_3$, $ZrO_2$, TiN and MgO.

These may be used singly or in combination of two or more or as a mixture, a solid solution or a composition of two or more.

These various compounds may be pure ones or may contain impurities as far as the object of the present invention is not damaged.

For example, carbides such as WC may contain a slight amount of excess carbon, excess metal or oxide and SiC may contain a small amount of TiC or the like.

Proportion of component (A) and component (B) used for the sintered body in the present invention is such that component (B) is usually 1-90% by weight, preferably 2-80, more preferably 3-70% by weight when the sum of component (A) and component (B) is 100% by weight.

If the amount of component (B) is less than 1% by weight, sinterability and strength of sintered body are insufficient and if it is more than 90% by weight, hardness of sintered body is insufficient.

Proportion of component (C) used for the sintered body in the present invention is usually 0.2-20, preferably 0.3-15, more preferably 0.5-10% by weight when sum of component (A), component (B) and component (C) is 100% by weight.

By specifying the proportion of component (C) within the above range, there is brought about the effect to stabilize the improvement in sinterability and strength and besides adhesion of diamond film can be further improved.

If amount of component (C) exceeds 20% by weight, hardness of sintered body, namely, diamond coated sintered body may be insufficient.

The sintered body in the present invention can be produced by various methods employed for production of known sintered type carbide based super hard materials, especially tungsten carbide sintered body using the above-mentioned specific components as raw materials.

That is, the sintered body can be obtained by grinding the above raw materials into suitable particle diameter (if necessary), mixing them at a given ratio, if necessary, with addition of auxiliary binder such as materials mainly composed of ethylene glycol, EVA (ethylene-vinyl acetate), polybutylene methacrylate or adamantane), press molding the mixture, preliminarily sintering the molded product (if necessary), and then sintering the product and processing the sintered body (if necessary).

The components used for the sintering can be used in any forms of powder, fine powder, ultrafine particle, whisker and others, but preferred are fine particles or ultrafine particles having an average particle diameter of usually about 0.05-4.0 $\mu$m, preferably about 0.05-2.0 $\mu$m or whiskers having an aspect ratio of about 20-200.

Use of these components which are finer in particle size increases strength of sintered body, but those of less than 0.05$\mu$ in average particle diameter are sometimes practically disadvantageous from the points of production method and cost.

Sintering temperature is usually 1,600°-2,200° C., preferably 1,600°-2,000° C.

Sintering time is usually 12 hours or more, preferably 12-24 hours.

In this way, sintered body used for diamond coated sintered body can be obtained.

This sintered body may be processed into desired shape before sintering or after sintering, it may be processed into desired shape, if necessary, and can be used as a body for the diamond coated sintered body of the present invention.

The respective components constituting the sintered body may have any forms of fine particle structure, composite metal compound and coarse particle structure or may be in the form of a mixture of them. Normally, preferred is one mainly composed of fine particle structure and composite metal compound.

The diamond coated sintered body of the present invention comprises the above sintered body and a diamond film formed on the desired surface of the sintered body by gas phase synthesis method. Besides, this diamond film can be formed efficiently and easily and at a uniform thickness.

If the gas phase synthesis method is applied to the conventional sintered body made of WC based super hard alloy, plasma is not uniformly converged and the thickness of diamond film is apt to be ununiform. When the gas phase synthesis method is applied to a sintered body made of ceramics such as $Si_3N_4$, there is the problem of decrease in film forming speed of diamond.

Thickness of the diamond film in the diamond coated sintered body of the present invention cannot be strictly specified for the reason that as stated before it is difficult to determine a clear interface between the diamond film and the sintered body, but usually it is about 0.1-100 $\mu$m, preferably about 0.2-30 $\mu$m.

If this diamond film is too thin, sometimes it cannot sufficiently coat the surface of the sintered body and if it is too thick, sometimes the diamond film peels off from the sintered body.

The term "diamond" used in the present invention includes not only diamond, but also diamond-like carbon and diamond which partically contains diamond-like carbon.

As carbon source gas used in formation of diamond film, there may be used various gases which are commonly used.

As the carbon source gas, there may be used, for example, paraffinic hydrocarbons such as methane, ethane, propane and butane; olefinic hydrocarbons such as ethylene, propylene and butylene; acetylenic hydrocarbons such as acetylene and allylene; diolefinic hydrocarbons such as butadiene and allene; alicyclic hydrocarbons such as cyclopropane, cyclobutane, cyclopentane and cyclohexane; aromatic hydrocarbons such as cyclobutadiene, benzene, toluene, xylene and naphthalene; ketones such as acetone, diethyl ketone and benzophenone; alcohols such as methanol and ethanol; other oxygen-containing hydrocarbons; amines such as trimethylamine and triethylamine; other nitrogen-containing hydrocarbons; carbon dioxide, carbon monoxide and carbon peroxide; the Fire Services Act, Dangerous Articles, the 4th class and the 1st class such as gasoline, the second petroleums such as kerosene, turpentine oil, and camphor oil, the third petroleums such as heavy oil and the fourth petroleums such as gear oil and cylinder oil, though these are not simple sintered body. These various carbon compounds may also be used as a mixture.

Among them, preferred are paraffinic hydrocarbons such as methane, ethane and propane, alcohols such as ethanol and methanol, ketones such as acetone and benzophenone, amines such as trimethylamine and triethylamine, carbon dioxide and carbon monoxide and mixtures thereof. Especially preferred are those which are mainly composed of carbon monoxide.

Furthermore, these may be used in admixture with active gases such as hydrogen or inert gases such as helium, argon, neon, xenon and nitrogen.

When the raw material gas contains methane gas ($CH_4$), the content of the methane gas is preferably less than 5 mol %.

The reason for carbon monoxide being especially preferred is that when a diamond film is formed by using raw material gas containing carbon monoxide in a high concentration of 1-80 mol %, the reaction does not stop at the surface of the sintered body and can be allowed to proceed to the deeper portion of the sintered body, namely, can proceed in the surface layer part where a compound such as carbide is present and as a result, adhesion between the sintered body and the diamond film can be further improved.

When carbon monoxide is used as a suitable carbon source gas, it is preferred to use carbon monoxide and hydrogen gas in combination. In case of using raw material gas comprising carbon monoxide and hydrogen gas in combination, the growing speed of diamond film is high. (For example, under the same conditions, the growing speed of the diamond thin film can be 2-10 times that when using a raw material gas comprising methane and hydrogen gas in combination).

The carbon monoxide has no special limitation and, for example, there may be used producer gas and water gas which are obtained by thermal reaction of coal or coke with air or water vapor and which are sufficiently purified.

The above hydrogen gas has no special limitation and, for example, there may be used hydrogen gas which is obtained by gasification of petroleum, modification of natural gas and water gas, electrolysis of water, reaction of iron with water vapor or complete gasification of coal and which are sufficiently purified.

When a mixed gas of hydrogen gas and carbon monoxide is used as a raw material gas, the content of carbon monoxide gas is usually 1-80 mol %, preferably 1-60 mol % and more preferably 2-60 mol %.

If the content of carbon monoxide gas in the mixed gas is less than 1 mol %, sometimes the growing speed of the diamond film is not sufficient and if the content of carbon monoxide gas is more than 80 mol %, sometimes the purity of the diamond component in the deposited diamond film is low.

The carbon source gas or raw material gas containing it in activated (excited) state is allowed to flow over the given surface of the sintered body usually together with a suitable carrier gas to cause contact reaction to form a diamond film of desired properties.

As the carrier gas, there may be used the above exemplified inert gases, and, if necessary, reactive gases such as hydrogen or mixed gas of these. Further, the carrier gas may contain additive gases such as water vapor and oxygen, if necessary.

In the present invention, for formation of diamond film, there may be utilized various known methods for gas phase synthesis of diamond film such as CVD method, PVD method, PCVD method and combination of these methods.

Among these methods, preferred are various hot filament methods (hot CVD methods) including EACVD method, various DC plasma CVD methods including hot plasma method, various radio-frequency plasma CVD methods including hot plasma method and microwave plasma CVD methods including ECR method or magnetic field method.

Reaction conditions for formation of diamond film have no special limitation and reaction conditions used for respective gas phase synthesis methods mentioned above can be applied.

For example, reaction pressure is usually $10^{-6}$ to $10^3$ Torr. Preferably $10^{-5}$ to $10^3$ Torr. If the reaction pressure is lower than $10^{-6}$ Torr, sometimes formation speed of the diamond thin film is low. Even if it is higher than $10^3$ Torr, a corresponding effect cannot be exhibited.

Reaction temperature (surface temperature of the the sintered body) varies depending on the means for activation of the raw material gas, etc. and cannot be simply specified, but is usually 300°-1,200° C., preferably 500°-1,100° C., sometimes formation or crystalline diamond film is insufficient and if it is higher than 1,200° C., etching of the formed diamond film readily occurs.

Reaction time is preferably optionally set depending on formation speed of the diamond film so that the diamond film of desired thickness can be formed.

In this way, the diamond coated sintered body of the present invention can be produced.

The diamond coated sintered body of the present invention is markedly superior to a conventional diamond (thin) film coated super hard alloys especially in adhesion between diamond film and sintered body.

Therefore, the diamond coated sintered body of the present invention can be suitably utilized as cutting tools such as bite drill, end mill and cutter; and super hard tools, wear resistant tools, and wear resistant body such as die, draw die, tap, gauge and head of bonding tools.

As explained in detail above, according to the present invention, since a sintered body comprising specific components is used as a body for coating diamond film, adhesion between the sintered body and the diamond film can be markedly improved and when the sintered body is used for cutting tools, super hard tools and wear resistance tools, a diamond coated sintered body of long life which can exhibit high performance and endurance can be provided. The advantages of the present invention will become further clear by the following examples.

EXAMPLE 1

A mixture comprising 94% by weight of WC having a particle diameter of 1.2 μm, 5% by weight of SiC having a particle diameter of 0.6 μm and 1% by weight of $ZrO_2$ having a particle diameter of 0.5 μm as raw materials of the sintered body was sintered by HIP (Hot Isostatic Pressing; pressing power 2,000 kg/cm²; pressing time 24 hours; temperature at pressing 1,800° C.) to obtain a sintered body of JIS SPGN 422.

A diamond film about 2 μm thick was formed on the surface of the above sintered body by known microwave plasma CVD method under the following conditions.
Frequency: 2.45 GHz
Output: 400 W
Sintered body temperature: 900° C.
Time: 1 hour
Pressure: 40 Torr
Raw material mixed gas (CO: 7 vol %):
 CO flow 7 sccm
 $H_2$ flow 93 sccm.

Then, the obtained diamond coated sintered body was used as a super hard tool and aluminum alloy containing 8 wt % of Si was cut thereby.
Material to be cut: aluminum alloy (AC4C-T6)
Cutting speed: 800 m/min
Cutting time: 10 min
Feeding: 0.1 mm/rev.
Depth of cut: 0.25 mm
Cutting oil: Aqueous emulsion oil.

As a result, it was recognized that the diamond coated sintered body used for cutting did not wear out in both the rake surface and the relief surface by cutting of 10 minutes or less.

EXAMPLES 2-6

Diamond coated sintered body were produced in the same manner as in Example 1 except that [WC/SiC (SiC powder 8% by weight and SiC whisker 2% by weight)], [WC/$Si_3N_4$ (10% by weight)], [WC/$B_4C$ (10% by weight)], [WC/$Si_3N_4$ (5% by weight)/$Y_2O_3$ (2% by weight)] and [WC/SiC (5% by weight)/TiN (3% by weight)] were respectively used as raw materials for the sintered bodies and these diamond coated sintered body were subjected to the same cutting test as in Example 1.

As a result, it was recognized that neither rake surface nor relief surface wore out for all of these diamond coated sintered body by cutting for 10 minutes or less.

EXAMPLES 7-13 AND COMPARATIVE EXAMPLES 1-2

Sintered bodies were prepared in the same manner as in Example 1 except that mixtures having the composition as shown in Table 1 were used as raw materials for sintered bodies.

A diamond film about 12 μm thick was formed on the surface of the above sintered bodies by known microwave plasma CVD method under the following conditions.
Frequency: 2.45 GHz
Output: 450 W
Substrate temperature: 1000° C.
Time: 5 hour
Pressure: 40 Torr
Raw material mixed gas (CO: 15 vol %):
 CO flow 15 sccm
 $H_2$ flow 85 sccm.

Then, the obtained diamond coated sintered bodies were used as super hard tools and aluminum alloy containing 12 wt % of Si was cut thereby under the following conditions.
Material to be cut: aluminum alloy (AC8A-T6)
Cutting speed: 600 m/min
Feeding: 0.1 mm/rev.
Depth of cut: 0.25 mm.

Time (cutting time) required for the diamond film peeling off from the diamond coated sintered body was measured to obtain the results as shown in Table 1. The cutting edge of the diamond coated sintered body of all of the examples was fused with difficulty even after the diamond film had peeled off.

TABLE 1

| | Compositions of sintered bodies (% by weight) | | | | | | | | Cutting time |
|---|---|---|---|---|---|---|---|---|---|
| | W C | $Si_3N_4$ | SiC whisker | $Y_2O_3$ | $Al_2O_3$ | $ZrO_2$ | MgO | Co | (min) |
| Example 7 | 35 | 63 | | 2 | | | | | 105 |
| Example 8 | 30 | 65 | | 2 | | 2 | 1 | | 144 |
| Example 9 | 30 | 68 | | 1 | | 1 | | | 116 |
| Example 10 | 45 | 50 | | 3 | 2 | | | | 108 |
| Example 11 | 60 | 32 | | | | 5 | 3 | | 85 |
| Example 12 | 50 | 35 | 10 | 3 | 2 | | | | 96 |
| Example 13 | 62 | 30 | | 2 | 3 | 3 | | | 90 |
| Comparative Example 1 | 94 | | | | | | | 6 | <2 |
| Comparative Example 2 | | 94 | | 3 | 3 | | | | 55 |

What is claimed is:
1. A diamond coated sintered body comprising:
 (1) a sintered body prepared from a mixture consisting essentially of (A) tungsten carbide and (B) at least one compound selected from the group consisting of carbides and nitrides of silicon or boron; and
 (2) a diamond film formed on the surface of said sintered body by a gas synthesis method.
2. A diamond coated sintered body according to claim 1, wherein said mixture is a mixture of WC and at least one compound selected from the group consisting of SiC, $Si_3N_4$ and $B_4C$.
3. A diamond coated sintered body according to claim 1, wherein said diamond film is formed by contacting a gas obtained by exciting a gas mixture of hydrogen gas and carbon monoxide by a microwave plasma CVD method with the surface of said sintered body.

4. A diamond coated sintered body according to claim 1, wherein the amount of component (B) is in the range of 1-90% by weight, based on the combined weight of components (A) and (B).

5. A diamond coated sintered body comprising:
  (1) a sintered body prepared from a mixture consisting essentially of (A) tungsten carbide, (B) at least one compound selected from the group consisting of carbides and nitrides of silicon or boron, and (C) at least one compound selected from the group consisting of carbides, oxides, nitrides, carbonitrides, carbonates, borides and organic compounds of at least one element selected from the group consisting of metals and rare earth elements belonging to Groups Ia, IIa, IIIa, IVa, Va, IIIb and IVb of Mendelejeff's periodic table; and
  (2) a diamond film formed on the surface of said sintered body by a gas synthesis method.

6. A diamond coated sintered body according to claim 5, wherein said component (C) is at least one compound selected from the group consisting of carbides, oxides and nitrides of at least one element selected from the group consisting of metals and rare earth elements belonging to Groups IIa, IIIa, IVa and IIIb of Mendelejeff's periodic table.

7. A diamond coated sintered body according to claim 5, wherein said component (C) is at least one compound selected from the group consisting of carbides, oxides and nitrides of at least one element selected from the group consisting of Mg, Y, B, Al, Ti and Zr.

8. A diamond coated sintered body according to claim 5, wherein said component (C) is at least one compound selected from the group consisting of $Y_2O_3$, $Al_2O_3$, $ZrO_2$, TiN and MgO.

9. A diamond coated sintered body according to claim 5, wherein the amount of component (C) is in the range of 0.2-20% by weight, based on the combined weight of components (A), (B) and (C).

10. A diamond coated sintered body according to claim 5, wherein said diamond film is formed by contacting a gas obtained by exciting a gas mixture of hydrogen gas and carbon monoxide by a microwave plasma CVD method with the surface of said sintered body.

* * * * *

UNITED STATES PATENT AND TRADEMARK OFFICE
CERTIFICATE OF CORRECTION

PATENT NO.  : 4,990,403

DATED       : February 5, 1991

INVENTOR(S) : Toshimichi ITO

It is certified that error appears in the above-identified patent and that said Letters Patent is hereby corrected as shown below:

On the title page, Item [30], insert:

-- Jan. 5, 1989 [JP]   Japan . . . . . . . . . . . 1-315935 --

Signed and Sealed this

Twenty-eighth Day of July, 1992

*Attest:*

DOUGLAS B. COMER

*Attesting Officer*   *Acting Commissioner of Patents and Trademarks*